(12) United States Patent
Afanou et al.

(10) Patent No.: US 12,058,805 B2
(45) Date of Patent: Aug. 6, 2024

(54) ELECTRICAL APPARATUS COMPRISING A POWER SEMICONDUCTOR MODULE AND AT LEAST ONE CAPACITOR

(71) Applicant: Hella GmbH & Co. KGaA, Lippstadt (DE)

(72) Inventors: Joël Afanou, Toulouse (FR); Olivier Vilain, Colomiers (FR)

(73) Assignee: Hella GmbH & Co. KGaA, Lippstadt (DE)

( * ) Notice: Subject to any disclaimer, the term of this patent is extended or adjusted under 35 U.S.C. 154(b) by 302 days.

(21) Appl. No.: 17/447,750

(22) Filed: Sep. 15, 2021

(65) Prior Publication Data

US 2022/0007491 A1 Jan. 6, 2022

Related U.S. Application Data

(63) Continuation of application No. PCT/EP2019/056799, filed on Mar. 19, 2019.

(51) Int. Cl.
*H05K 1/02* (2006.01)
*H05K 1/18* (2006.01)

(52) U.S. Cl.
CPC ............. *H05K 1/021* (2013.01); *H05K 1/182* (2013.01); *H05K 2201/10015* (2013.01); *H05K 2201/10621* (2013.01)

(58) Field of Classification Search
CPC ...... H05K 7/2039; H05K 1/021; H05K 1/182; H05K 2201/10015; H05K 2201/10621; H05K 7/2089; H05K 7/209; H05K 9/0022; H05K 9/0024; H05K 9/0026
See application file for complete search history.

(56) References Cited

U.S. PATENT DOCUMENTS

| | | | | |
|---|---|---|---|---|
| 5,497,289 | A * | 3/1996 | Sugishima | H05K 7/209 361/600 |
| 9,237,679 | B2 * | 1/2016 | Schoerner | H05K 7/1432 |
| 9,402,319 | B2 * | 7/2016 | Vinciarelli | H05K 5/065 |
| 9,788,410 | B2 * | 10/2017 | Uchiyama | H05K 7/1432 |
| 9,966,193 | B2 * | 5/2018 | Matsumoto | H01L 25/072 |
| 10,778,117 | B2 * | 9/2020 | Song | H05K 7/14329 |
| 2019/0120455 | A1 * | 4/2019 | Badia | F21S 45/47 |
| 2019/0244874 | A1 * | 8/2019 | Yoshikawa | H01L 23/49822 |
| 2021/0014999 | A1 * | 1/2021 | Denk | H05K 7/20927 |

FOREIGN PATENT DOCUMENTS

| | | |
|---|---|---|
| CN | 108880283 A | 11/2018 |
| CN | 208077965 U | 11/2018 |
| JP | 05067082 U | 9/1993 |
| JP | 08086473 A | 4/1996 |
| JP | 2000092847 A | 3/2000 |
| JP | 3324439 B2 | 9/2002 |

* cited by examiner

*Primary Examiner* — Jacob R Crum
*Assistant Examiner* — Matthew Sinclair Muir
(74) *Attorney, Agent, or Firm* — Husch Blackwell LLP

(57) ABSTRACT

An electrical apparatus is provided with a power semiconductor module, at least one capacitor, a circuit carrier, and a first heat sink. The power semiconductor module and the circuit carrier are arranged on the first heat sink. The electrical apparatus comprises a second heat sink arranged on the power semiconductor module and connected to the first heat sink.

12 Claims, 4 Drawing Sheets

ELECTRICAL APPARATUS COMPRISING A POWER SEMICONDUCTOR MODULE AND AT LEAST ONE CAPACITOR

CROSS REFERENCE

This application claims priority to PCT Application No. PCT/EP2019/056799, filed Mar. 19, 2019, the entirety of which is hereby incorporated by reference.

FIELD OF THE INVENTION

The invention concerns an electrical apparatus with a power semiconductor module, at least one capacitor, a circuit carrier and a first heat sink, wherein the power semiconductor module and the circuit carrier are disposed on the first heat sink.

BACKGROUND

Various electrical devices with semi-conductor power modules of the aforementioned type are known from the state of the art. In one of these electrical devices, capacitors and various other power components, such as chokes, are arranged on the circuit carrier adjacent to the power module. A remaining area of the circuit carrier is available for the arrangement of other components, which is necessary, for example, for the control of the power semiconductor module. The power semiconductor module is connected to the conductive lines and the components on the circuit carrier.

Such electrical devices are also used in motor vehicles. Circuit arrangements used in motor vehicles often require the electrical equipment to be compact and take up little installation space.

A further problem with electrical devices with a power stage is that heat is generated in the power stage, such as in a power semiconductor module, which must be dissipated to prevent damage to the power semiconductor module. Heat is more difficult to dissipate in compact electrical devices where components are densely packed than in circuit arrangements where the components are at a greater distance, as there is usually a larger area available to dissipate the heat to the environment by convection or radiation.

SUMMARY OF THE INVENTION

The invention was therefore based on the task of improving heat dissipation with an electrical device of the type mentioned above.

This task is solved by the fact that the electrical device has a second heat sink which is arranged on the power semiconductor module and connected to the first heat sink. This second heat sink improves heat transfer from the power semiconductor module: not only the first heat sink on which the power semiconductor module is mounted is available for the transport, but also the second heat sink which is mounted on the power semiconductor module. By connecting the second heat sink, which is preferably much smaller than the first heat sink and thus has only a fraction of the mass of the first heat sink, for example, the heat transferred from the power semiconductor module to the second heat sink can be transferred to the first heat sink.

A further advantage of the second heat sink is that it can serve as a carrier of components of a circuit arrangement of the electrical device, for example the at least one capacitor. The at least one capacitor can be arranged on the second heat sink. It is also possible that at least one capacitor is arranged above the second heat sink, but is not firmly connected to the second heat sink. The capacitor can have contact pins, especially press-fit contacts, which pass through recesses in the second heat sink and are connected to the power semiconductor module. The power semiconductor module can have sockets or receptacles in which the contact pins are electrically contacted and fastened.

If the capacitor is mounted on or above the second heat sink, a compact design of the electrical device is possible.

The second heat sink can be connected to the power semiconductor module by screws or other connecting means. The second heat sink can also be connected to the first heat sink by screws or other connecting means. Instead of using connecting means, the connection can also be made by adhesive joining. The heat transfer at the joints can be improved by using a heat conducting paste.

The second heat sink may have at least one side wall which may be substantially perpendicular to the first heat sink. The side wall can be attached to the power semiconductor module. This allows additional heat transfer from the power semiconductor module to the second heat sink.

The side wall can abut on the first heat sink. The side wall may have a collar resting on the first heat sink. The collar increases the heat transfer from the second heat sink to the first heat sink and facilitates the heat transfer.

The collar can be attached to the first heat sink.

The capacitor can preferably be a stack-up capacitor or a stacked capacitor. The capacitor can in particular be a plastic film capacitor.

BRIEF DESCRIPTION OF THE DRAWINGS

Reference is now made more particularly to the drawings, which illustrate the best presently known mode of carrying out the invention and wherein similar reference characters indicate the same parts throughout the views.

DETAILED DESCRIPTION OF THE DRAWINGS

Figure 1:
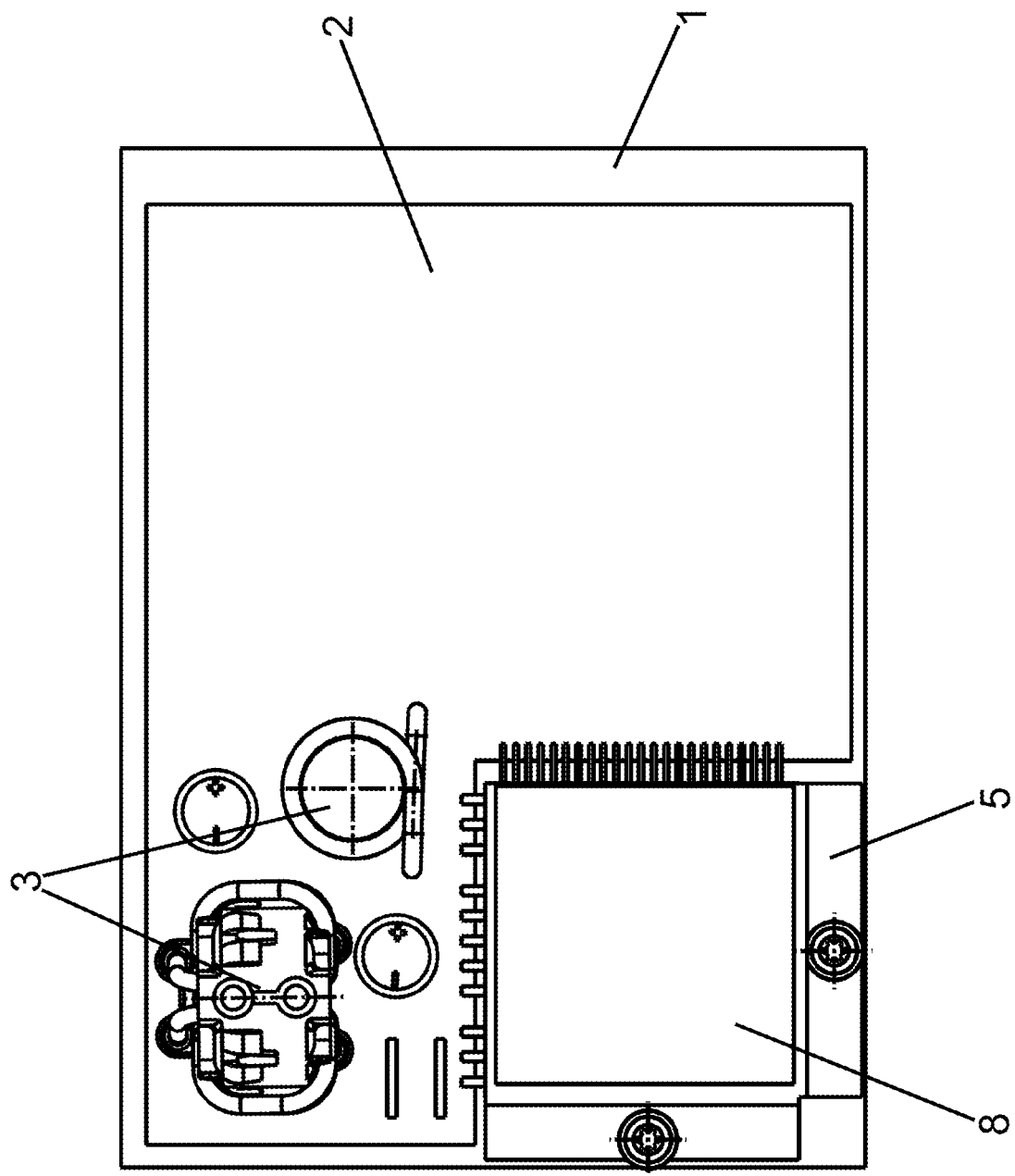
FIG. 1 is a simplified top view of an electrical device according to the invention.
Figure 2:
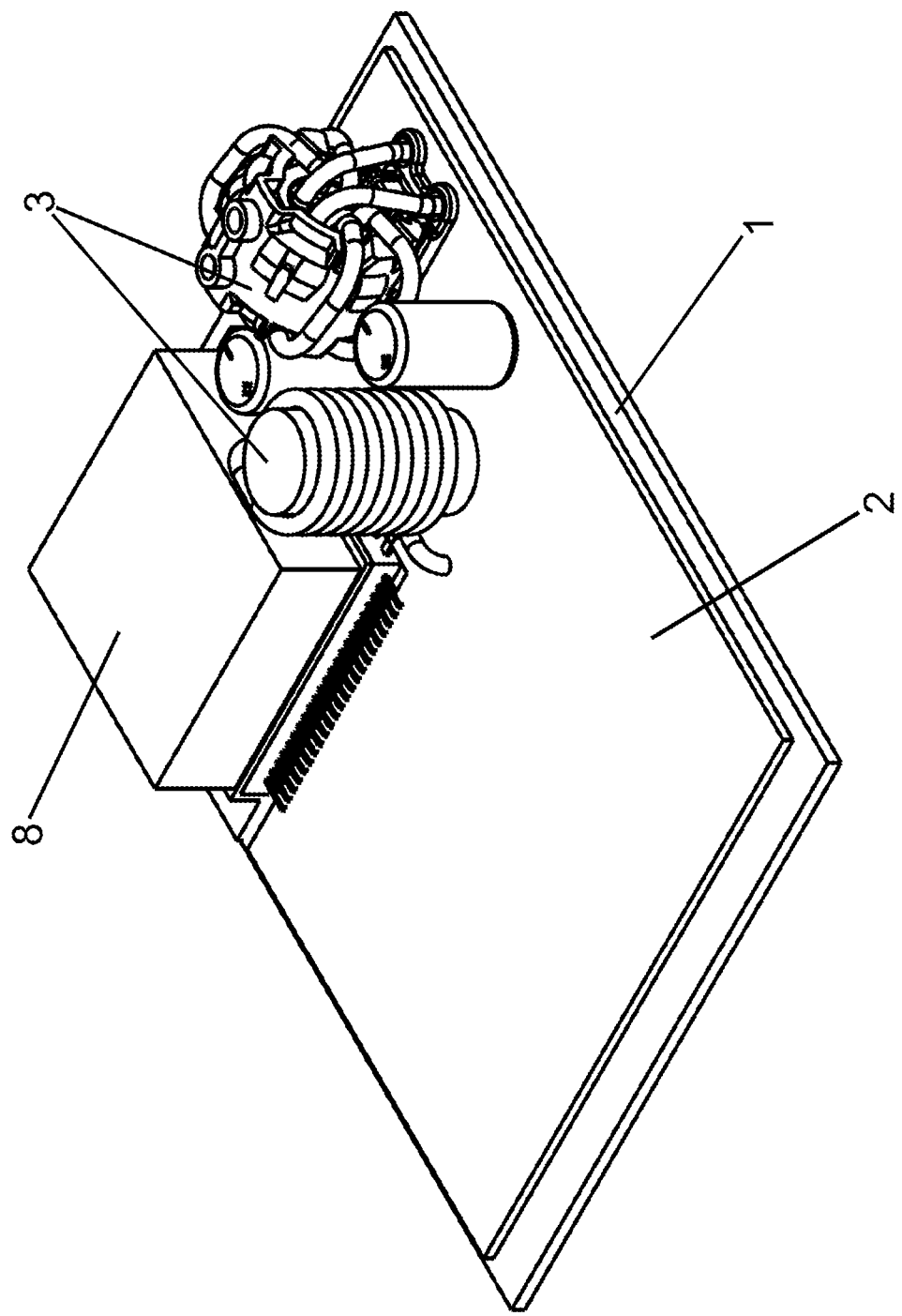
FIG. 2 is a simplified perspective view of the electrical device.
Figure 3:
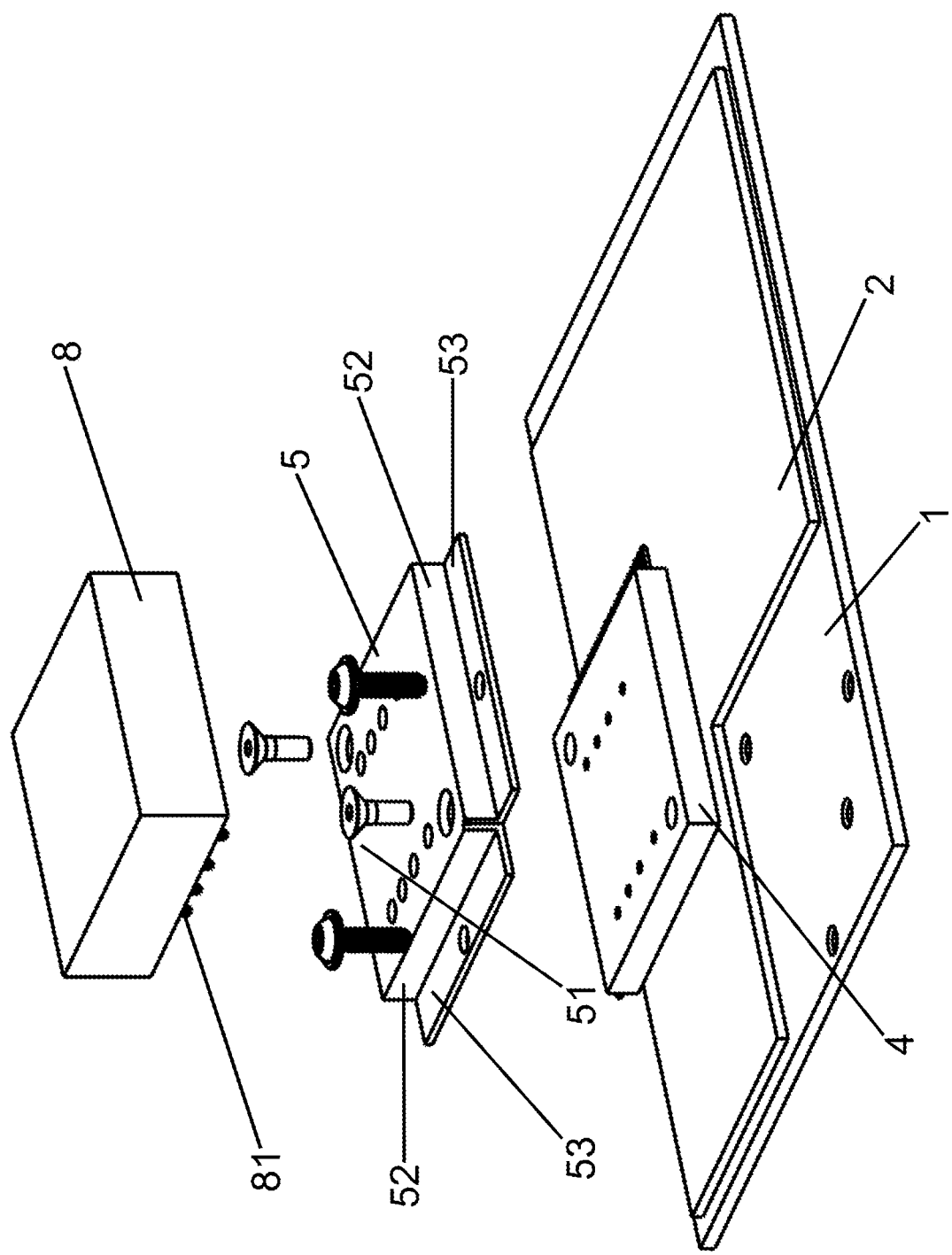
FIG. 3 is a first simplified perspective exploded view of the electrical device.
Figure 4:
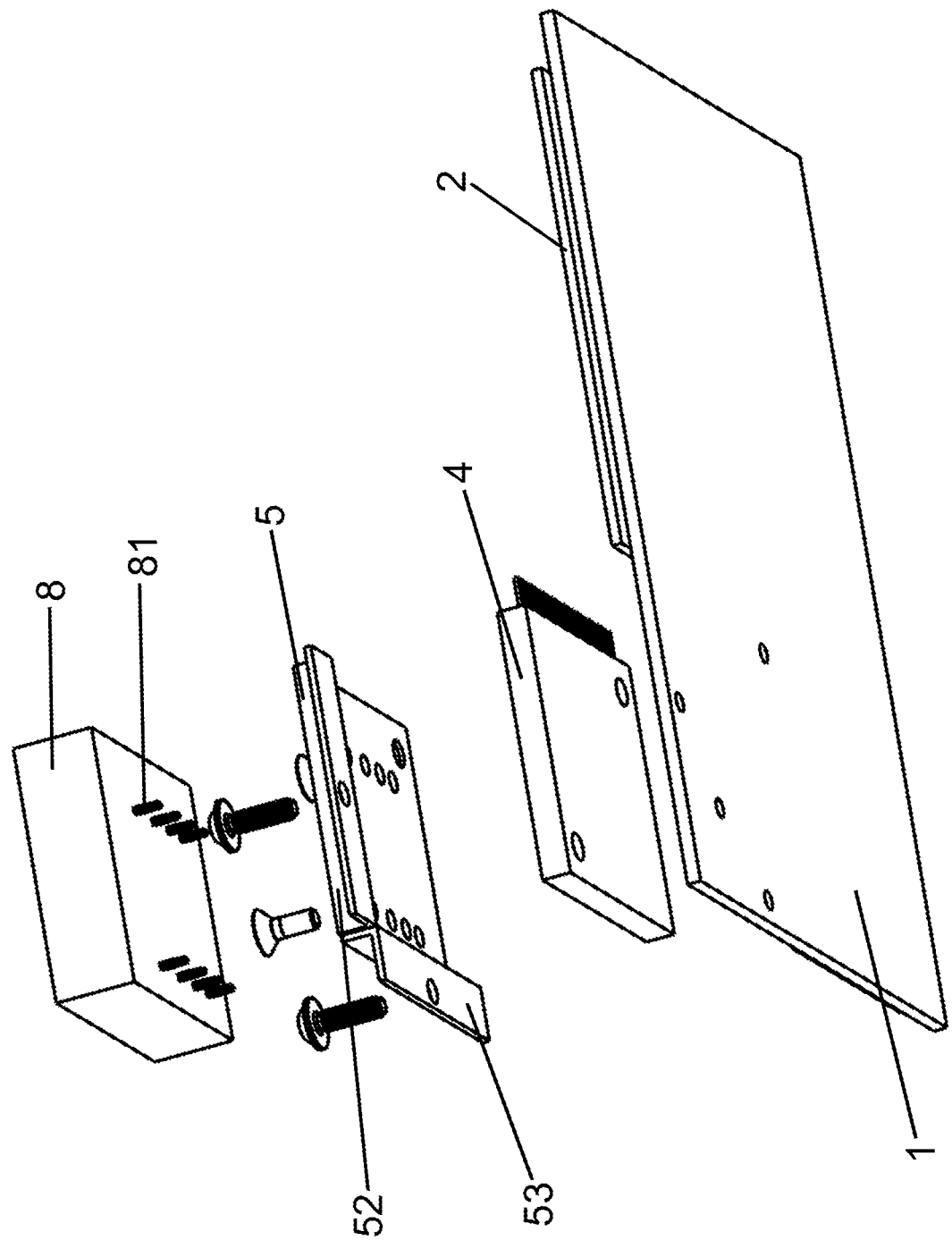
FIG. 4 a second simplified perspective exploded view of the electrical device.

The simplified representation of the invention of the electrical device in the figures shows a first heat sink 1. The first heat sink 1 is an aluminium plate.

A circuit carrier, preferably a printed circuit board 2, is mounted on the first heat sink. Printed circuit board 2 contains printed conductors and various components which are not shown or not all shown. Shown are, for example, chokes 3. The circuit carrier covers one side of the heat sink almost completely. Only in one corner is a surface left out. A power semiconductor module 4 is arranged in this area, which is connected to the printed conductors and/or components on the printed circuit board 2 via contact pins.

The power semiconductor module 4 has a housing in which several power semiconductor components are accommodated.

On the power semiconductor module 4, a collar 53 on two sides surrounding a second heat sink 5 is provided. This comprises a plate 51, which rests on the top side of the power semiconductor module 4. Two side walls 52 of the second heat sink 5 are attached to the outer walls of the power semi-conductor module 4. At the ends of the two side walls 52 collar 53 are foreseen. The second heat sink 5 is firmly connected to the first heat sink 1 with screws 6, which are guided through the collar 53. In addition, the second heat sink 5 is firmly connected to the power semiconductor module 4 with screws 7.

A capacitor 8 is arranged above the second heat sink 5. It is a capacitor module with several capacitors which can be connected to the power semiconductor module via contact pins 81. The contact pins 81 project through recesses in the plate 51 of the second heat sink 5 and are inserted into sockets or receptacles of the power semiconductor module 4. The contact pins 81 are electrically contacted and fixed in the sockets or receptacles, whereby the capacitor 8 is fastened in whole.

REFERENCE CHARACTER LIST

1 first heat sink
2 printed circuit board
3 chokes
4 power semiconductor module
5 second heat sink
51 plate
52 side walls
53 collar
6 screws
7 screws
8 capacitor
81 contact pins

The invention claimed is:

1. An electrical device comprising:
a first heat sink;
a circuit carrier arranged on the first heat sink;
a second heat sink connected to the first heat sink;
a power semiconductor module positioned between the first heat sink and the second heat sink; and
at least one capacitor, the second heat sink positioned between the at least one capacitor and the first heat sink,
wherein the at least one capacitor has contact pins which pass through recesses of the second heat sink and are connected to the power semiconductor module.

2. The electrical device according to claim 1, wherein the capacitor is arranged on the second heat sink.

3. The electrical device according to claim 1, wherein the second heat sink has at least one side wall which is preferably arranged substantially perpendicularly to the first heat sink.

4. The electrical device according to claim 3, wherein the at least one side wall is in contact with the power semiconductor module.

5. The electrical device according to claim 3, wherein the at least one side wall rests on the first heat sink.

6. The electrical device according to claim 3, wherein the at least one side wall has a collar which rests on the first heat sink.

7. The electrical device according to claim 6, wherein the collar is attached to the first heat sink.

8. The electrical device according to claim 1, wherein the capacitor is a stack-up capacitor or a stacked capacitor.

9. An electrical device comprising:
a first heat sink having a first area;
a circuit carrier arranged on the first heat sink;
a power semiconductor module arranged on the first heat sink;
a second heat sink having a second area disposed on the power semiconductor module and connected to the first heat sink; and
at least one capacitor disposed on the second heat sink,
wherein the second area is less than the first area, and
wherein the at least one capacitor has contact pins which pass through recesses of the second heat sink and are connected to the power semiconductor module.

10. The electrical device of claim 9, wherein the second area is less than half of the first area.

11. The electrical device of claim 9, wherein the first heat sink has a first mass and the second heat sink has a second mass, the second mass being less than the first mass.

12. The electrical device of claim 11, wherein the second mass is less than half of the first mass.

* * * * *